United States Patent [19]
Sadhir et al.

[11] Patent Number: 5,363,069
[45] Date of Patent: * Nov. 8, 1994

[54] ELECTRONICALLY TUNABLE GAIN EQUALIZER

[75] Inventors: Virender K. Sadhir; David A. Willems, both of Roanoke, Va.; Kenneth S. Karsten, Jr., Bethlehem, Pa.

[73] Assignee: ITT Corporation, New York, N.Y.

[ * ] Notice: The portion of the term of this patent subsequent to Feb. 1, 2011 has been disclaimed.

[21] Appl. No.: 42,548

[22] Filed: Apr. 5, 1993

[51] Int. Cl.$^5$ ............................................... H03H 7/03
[52] U.S. Cl. ...................................... 333/28 R; 333/23
[58] Field of Search ............... 333/28 R, 32, 33, 81 A, 333/204, 23; 330/277, 286

[56] References Cited

U.S. PATENT DOCUMENTS

| | | | |
|---|---|---|---|
| 3,495,190 | 2/1970 | Ross | 333/28 R |
| 4,437,073 | 3/1984 | Thal, Jr. | 333/28 R |
| 4,754,229 | 6/1988 | Kawakami et al. | 333/32 X |
| 4,978,932 | 12/1990 | Gupta et al. | 333/81 A X |
| 5,283,539 | 2/1994 | Sadhir et al. | 333/28 R |

FOREIGN PATENT DOCUMENTS

| | | | |
|---|---|---|---|
| 2734436 | 2/1979 | Germany | 333/28 R |
| 35579 | 3/1980 | Japan | 333/28 R |

*Primary Examiner*—Paul Gensler
*Attorney, Agent, or Firm*—Arthur L. Plevy; Patrick M. Hogan

[57] ABSTRACT

An equalizer circuit for equalizing RF frequencies implemented as an MMIC or MIC having a series of microstrip transmission lines between an RF input terminal and an RF output terminal and having at least one shunt path comprised of a series combination of a FET able to be switched between a conducting state and a nonconducting state and a stud tuner microstrip transmission line, wherein the FET is used as a voltage variable resistor to selectively de-Q the stub tuner and thereby control the depth of the equalization curve. In a modified embodiment, artificial transmission lines which include a plurality of inductive elements and FETs are coupled to each shunt path, wherein the shunt paths may be selectively shorted by changing the state of the FETs, thereby permitting the center frequency of the equalizer circuit to be shifted as well.

16 Claims, 4 Drawing Sheets

ELECTRONICALLY TUNABLE GAIN EQUALIZER

FIELD OF THE INVENTION

The present invention relates to equalizer circuits and more particularly to an electronically tunable equalizer circuit which can be fabricated either as a hybrid of microstrip transmission lines and surface mounted resistors, or as part of a completely monolithic device which includes microstrip transmission lines.

BACKGROUND OF THE INVENTION

A great deal of attention has been directed to the applications of travelling-wave tubes (TWTs) as channel amplifiers and at this time they are currently being used for frequency ranges from about 2 Gigahertz (GHz) to 16 Ghz. One phenomenon observed in connection with TWTs is that they produce higher gains and power output at the center of their operational band. That is, TWTs generally exhibit parabolic gain shapes where the gain is at a maximum at the center operating frequencies.

Many electrical systems, however, require constant gain and power output across their operational band. For this reason, components such as TWTs, which exhibit undesirable amplitude and/or gain variation across a frequency band, are typically "equalized" by an equalizer circuit to reduce the amplitude or gain variation to less than a few dB over relatively broad frequency bands.

Equalizers are either passive or active circuits having a predictable, controlled attenuation slope or characteristic versus frequency. Depending upon the characteristic of the signal they equalize, equalizers fall into one of two categories: parabolic or linear. Many conventional equalizers are of the low voltage standing wave ratio (VSWR) or absorptive type consisting of a fixed parabolic equalizer and an absorptive fine grain equalizer (FGE). Often, the bandwidth range of conventional equalizers is too narrow to correct the gain variations across the frequency bands of certain devices, for example TWTs. In an effort to equalize the gain of such devices, hybrid variable coaxial equalizers have been employed.

Hybrid variable coaxial equalizers generally consist of a main transmission line between an RF input and an RF output, wherein the transmission line has multiple transverse electromagnetic mode (TEM) resonant shunt branches coupled along its length. A fixed equalizer has fixed lengths for each shunt branch or stub tuner with a lossy coating at the end of each stub cavity. By contrast, a variable coaxial equalizer has variable stub lengths. The amount of coupling between the input line and shunt stubs is varied, by mechanically adjusting the position of a lossy coated plug at the end of a stub cavity, so as to alter the equalization profile and produce the desired flattening of the gain. For variable coaxial equalizers, coverage of up to two and one half (2.5) octaves is common with up to 20 watts of power capability. A coaxial equalize while tunable to compensate for a variety of device gain responses, still possesses certain disadvantages. The principal drawbacks are large size and weight, and high cost. Typical dimensions for a variable coaxial equalizer operating at 6-18 Ghz, 5 watts with 15 dB mid band attenuation are on the order of 1.25×1.0×0.5 inches and weight about 100 grams or more.

In co-pending application Ser. No. 07/942,728 filed Sep. 9, 1992 issued on Feb. 1, 1994 as U.S. Pat. No. 5,283,539 and entitled MONOLITHIC COMPATIBLE, ABSORPTIVE, AMPLITUDE SHAPING NETWORK, there is disclosed a miniaturized variable equalizer circuit which can be fabricated either as a hybrid of microstrip transmission lines and surface mounted resistors, or as part of a completely monolithic device which includes microstrip transmission lines. The equalizer disclosed therein uses a band-stop filter configuration, but replaces the capacitive coupling with resistive coupling in the form of resistive means coupled to one or more stub tuners. The resistive means is utilized to de-Q the stub tuner, thereby permitting the attenuation profile of the equalizer circuit to be selectively determined. Specifically, the amount of resistive coupling controls the depth of the equalization curve and changing the length of the resonators moves the center frequency of the equalizer. While providing a smaller, lighter, and less expensive variable equalizer, the device disclosed in the aforementioned application is unable to shift its loss profile to different frequencies.

It is an object of this invention to provide an equalizer circuit which may be configured as a microwave integrated circuit (MIC) or a monolithic microwave integrated circuit (MMIC) and which achieves broadband performance without any of the aforementioned limitations found in conventional equalizers.

SUMMARY OF THE INVENTION

The present invention is an equalizer circuit for RF frequencies comprising a microstrip transmission line having at least one stub tuner extending transversely therefrom and further having a voltage variable resistive means coupled to at least one stub tuner to de-Q that stub tuner, thereby selectively determining an attenuation profile for the equalizer circuit. The equalizer circuit of the present invention can be fabricated either as a hybrid of microstrip transmission lines and surface mounted resistors, or as part of a completely monolithic device which includes microstrip transmission lines. In a modified embodiment, artificial transmission lines are coupled to the stub tuners to provide means for electronically adjusting the length of the stub tuners and thereby shift the center frequency of the equalizer circuit.

BRIEF DESCRIPTION OF THE DRAWINGS

For a better understanding of the present invention, reference is made to the following description of an exemplary embodiment of thereof, considered in conjunction with the accompanying drawings in which.

DETAILED DESCRIPTION OF THE INVENTION

Figure 1:
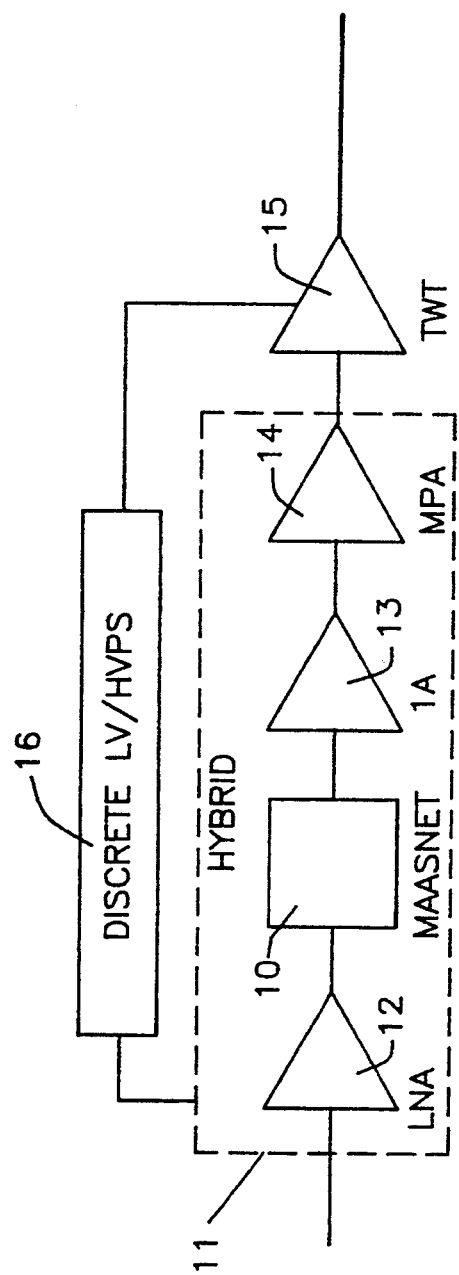
FIG. 1 is a block diagram depicting an equalizer circuit as a hybrid component in a low noise travelling wave tube driver.

Referring now to FIG. 1 there is shown a monolithic compatible, absorptive, amplitude shaping network (MAASNET) equalizer circuit 10. This circuit is shown in the above-noted copending application Ser. No. 07/942,728. The equalizer circuit 10 is depicted as one hybrid component in a hybrid amplifier device used as a low-noise TWT driver 11. The hybrid driver 11 also includes a low noise amplifier (LNA) 12, an isolation amplifier (IA) 13 having a given gain, and a medium power amplifier (MPA) 14. The output of the LNA 12 is coupled to the input of the MAASNET equalizer circuit 10 and the output of the equalizer circuit 10 is coupled to the input of the IA 13. The output of the IA 13 is coupled to the input of the MPA 14. The output of the MPA 14, which corresponds to the output of the hybrid driver 11, is coupled to the input of a TWT 15 which receives operating potential from a power supply (LV/HVPS) 16. The LV/HVPS 16 also supplies operating potential to the hybrid driver 11. The MAASNET equalizer circuit 10 operates to equalize the gain characteristic of the TWT 15 and to match impedances between the LNA 12 and the MPA 14. In the low-noise TWT driver 11, the output of the LNA 12 is further amplified by the MPA 14.

Since the hybrid driver 11 of FIG. 1 includes the hybrid MAASNET equalizer 10, the TWT 15 employed can be smaller and lighter than a single high gain TWT without gain equalization as may be implemented in the prior art. The overall size reduction between the MAASNET equalizer and conventional equalizers, using presently available components, is on the order of thirty percent for the type of application shown in FIG. 1.

A MAASNET equalizer circuit 10, which utilizes microstrip transmission lines, can be incorporated into a multifunctional chip consisting of various circuits. e.g., LNA and MPA. Since the MAASNET equalizer is a planar circuit, it may be fabricated either as a monolithic microwave integrated circuit (MMIC) or as a microwave integrated circuit (MIC) which is a planar hybrid on a ceramic. No degradation in the equalizer circuit's performance results from the lossy nature of the circuit, even if preceding and succeeding circuits have poor VSWR's.

Microstrip transmission lines generally comprise a conductor situated above or between extending conducting surfaces and are used in circuits where discrete devices are bonded to the circuit, and where a compact design is needed. Microstrip lines only approximate a TEM transmission line. However, dispersion will not be a problem unless the circuit is to be used for very broad bandwidth applications or it is physically many wavelengths long.

Monolithic RF circuits are usually designed on a thin semi-insulating substrate of GaAs or some other semiconductor. By definition, a monolithic circuit is formed completely by a deposition method such as liquid phase epitaxy, vapor phase epitaxy, or the like. Among the circuit elements which can be formed on monolithic substrates are transmission lines, thin-film resistors, FETs, and transmission line stubs. Microstrip transmission lines in monolithic devices can be made with a characteristic impedance as high as 90 ohms on a 125 μm GaAs substrate. Since a monolithic circuit is manufactured using automated techniques, no final adjustment can be made once it has been produced. The circuit design must therefore rely heavily on computer modeling and optimization. Monolithic circuits are ideal for microwave applications requiring large numbers of compact units because they offer low manufacturing costs and good unit-to-unit repeatability.

MMIC and MIC configured equalizer circuits are approximately ten times smaller and lighter than conventional equalizers. The interconnections at chip level for MMIC and MIC configured equalizers in a multifunctional circuit are such that separate RF input and RF output connectors (e.g., SMA type connectors for 6-18 Ghz) are obviated. Moreover, the package housings typically used in conventional equalizers are also made unnecessary. The construction details of MMIC and MIC configured equalizer circuits using microstrip transmission lines are discussed in significant detail in U.S. application Ser. No. 07/942,728, the disclosure of which is incorporated herein by reference.

Figure 2:
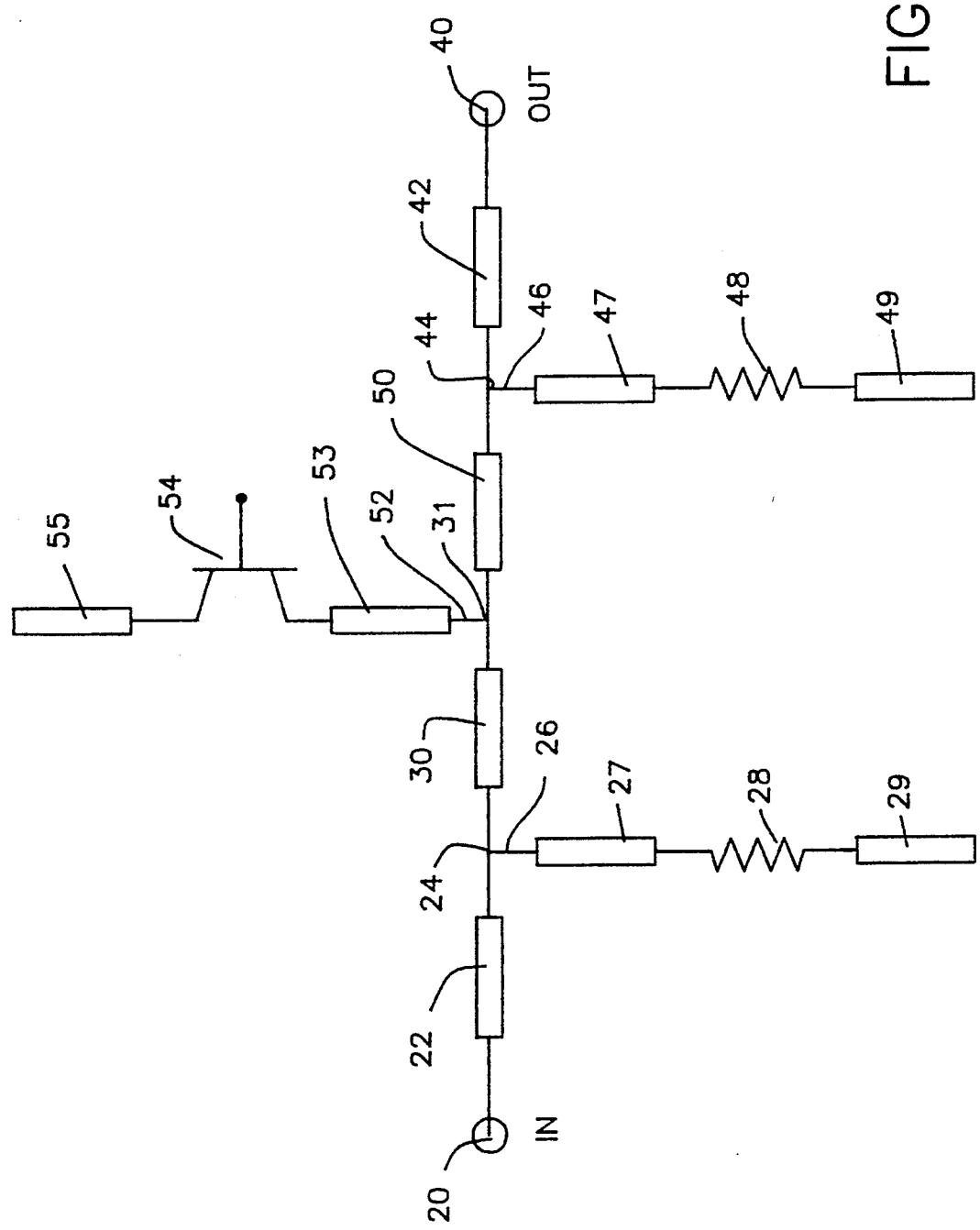
FIG. 2 shows a hybrid embodiment of an equalizer circuit using a field effect transistor (FET) as a voltage variable resistor.

In accordance with one embodiment of the present invention, FIG. 2 shows an MIC configured equalizer circuit 17 fabricated on a 15-mil thick alumina substrate and designed to operate in a frequency range of from 6 to 18 Ghz. The design has three lossy stub tuners which are connected to a main transmission line comprised of a plurality of microstrip lines coupled in series. The microstrip lines of the main transmission line are approximately λ/4 apart at the center frequency, where λ is determined from the ratio of the speed of light to the center frequency. The dimensions and values of both the microstrip lines and the resistors were arrived at after optimizing for a parabolic attenuation curve and In/Out VSWR.

The input terminal 20 of the equalizer circuit shown in FIG. 2 is coupled to the input terminal of microstrip line 22 which is 8 mils wide and 9.75 mils long. The output terminal of microstrip line 22 is coupled to T-junction 24 which has an outgoing shunt path 26. Shunt path 26 is comprised of the series combination of stub tuner microstrip line 27, resistor 28, and open ended microstrip line 29. Stub tuner microstrip line 27 is 14.5 mils wide and 15 mils long. The output terminal of line 27 is coupled to the input terminal of the 55-Ω a GaAs resistor 28. The output terminal of resistor 28 is coupled to input terminal of open-ended microstrip 29 which is 1 mil wide and 80 mils long. Microstrip line 30, which is 8 mils wide and 90 mils long, is coupled between T-junction 24 and T-junction 31.

The RF output terminal 40 of the equalizer circuit shown in FIG. 2 is coupled to the output terminal of microstrip line 42 which is 5.1 mils wide and 10 mils long. The input terminal of microstrip line 42 is coupled to T-junction 44 which has an outgoing shunt path 46. Shunt path 46 is comprised of the series combination of stub tuner microstrip line 47, resistor 48, and open ended microstrip line 49. Stub tuner microstrip line 47 is 14.5 mils wide and 10 mils long. The output terminal of line 47 is coupled to the input terminal of the 200-Ω GaAs resistor 48. The output terminal of resistor 48 is coupled to input terminal of open-ended microstrip 49 which is 6 mils wide and 20 mils long. Microstrip line 50, which is 12 mils wide and 113.3 mils long, is coupled between T-junction 43 and T-junction 31.

Figure 3:
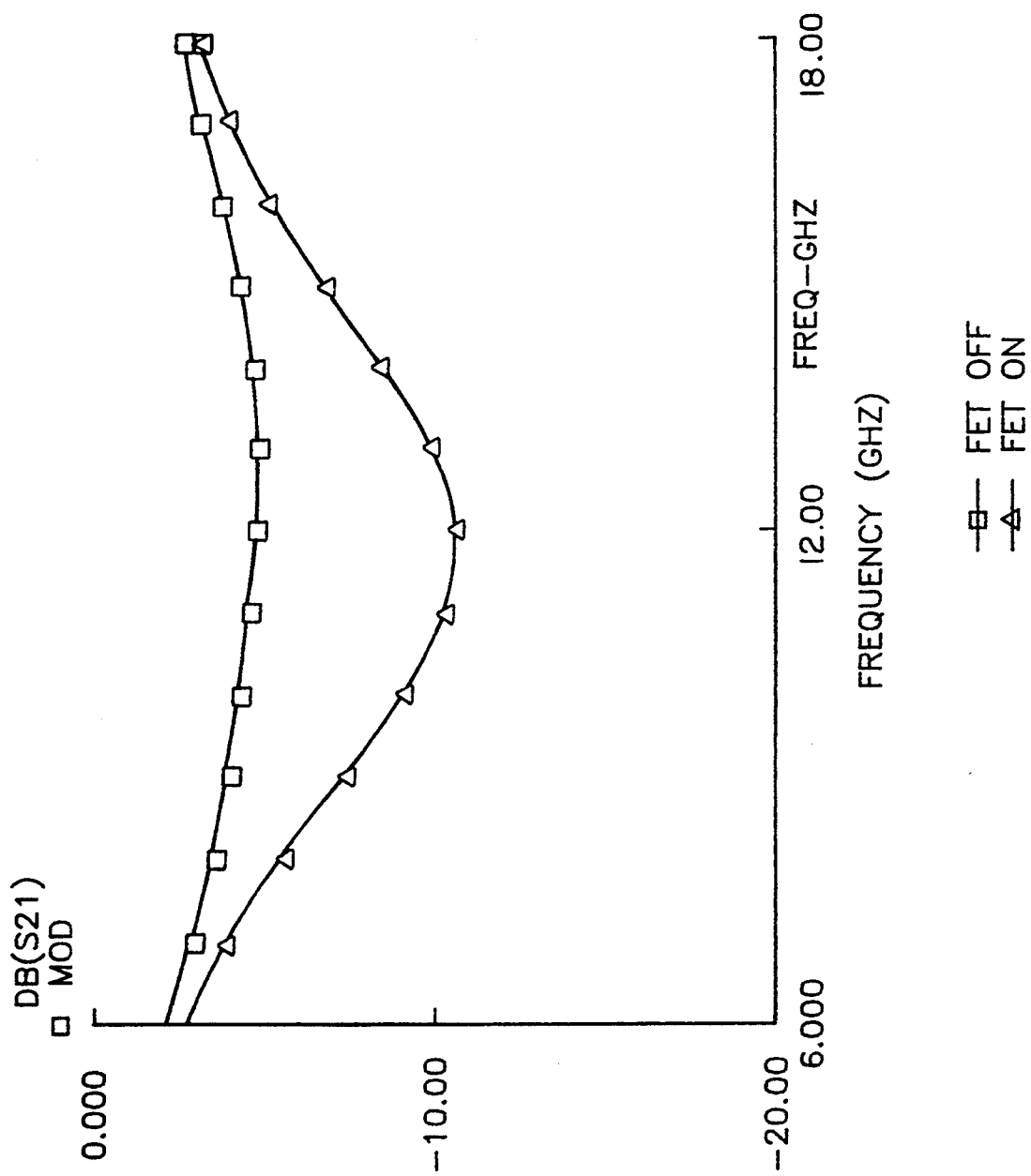
FIG. 3 is a graph showing the frequency v. attenuation response curves when the FET is adjusted to give its maximum and minimum amounts of resistance.

In accordance with the present invention, centrally located T-junction 31 has an outgoing shunt path 52 comprised of the series combination of stub tuner microstrip line 53, field effect transistor 54, and open ended microstrip line 55. Stub tuner microstrip line 53 is 8.25 mils wide and 14.5 mils long. The output terminal of microstrip line 53 is coupled to the source electrode of field effect transistor (FET) 34. The drain electrode of FET 54 is coupled to the input terminal of open-ended microstrip line 55, which, for example, is 2 mils wide and 70 mils long. FET 54 acts as a passive device in that it can not provide any gain unless a voltage bias is applied between the drain and source electrodes. When a voltage below pinchoff is supplied to the gate electrode of FET 54 and its drain and source are held at ground, FET 54 acts as a voltage variable resistor with the resistance value inversely proportional to the gate control voltage. FIG. 3 shows the frequency v. attenuation response of the equalizer circuit embodiment shown in FIG. 2 with the voltage supplied to FET 54 varied to provide maximum and minimum amounts of resistance.

Although it is contemplated that resistors 28 and 48 may be replaced with FETs to provide variable resistance at those locations as well, coupling a single FET to a centrally disposed transverse shunt path is preferred for several reasons. First, the control voltage is relatively easy to generate. If several FETs are used, each requires a different control voltage, thereby necessitating a complex drive circuit. Second, varying the values of resistance proximate the input and output of the equalizer circuit affects the return loss of the equalizer. When only the center resistance is varied, however, the return loss remains substantially constant across the range of attenuation shapes. Finally, FETs used as variable resistors are not pure resistances, but have both inductive and capacitive parasitics which can adversely affect the performance of the equalizer. It will be readily appreciated that such parasitics are minimized when only a single FET is used. Beneficially, parasitics present in the center of the equalizer structure can be at least partially absorbed.

Figure 4:
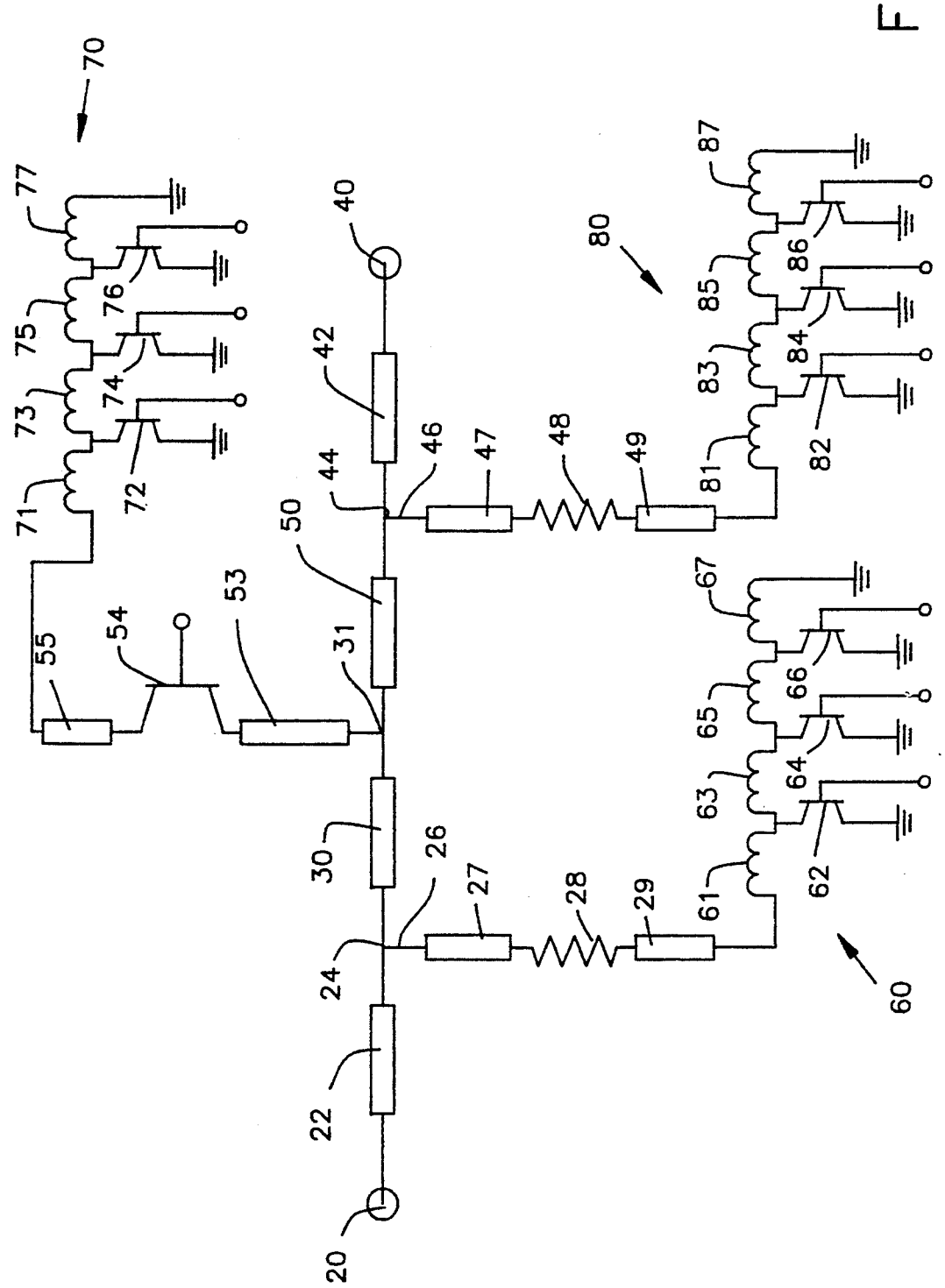
FIG. 4 shows another embodiment of an equalizer circuit using an artificial transmission lines comprising inductive elements and FETs to shift the center frequency of the equalizer.

FIG. 4 shows an alternate embodiment of an equalizer circuit, wherein like numerals are used to denote like parts. In the embodiment illustrated in FIG. 4, the shunt paths 26, 46, and 52 are modified in that the open circuit configuration provided by open-ended microstrip lines 29, 49, and 55 in FIG. 2 is replaced with a short circuit configuration in order to permit the center frequency of the equalizer to be shifted. For this purpose, artificial transmission lines 60, 70 and 80 are connected to microstrip lines 29, 55, and 49 respectively.

Artificial transmission line 60 comprises inductive elements 61, 63, 65 and 67, which are coupled together in series to microstrip line 29. Adjacent inductive elements are coupled together at a T-junction. To the remaining leg of each respective T-junction is coupled a corresponding FET 62, 64 or 66. The sources of FETs 62, 64, and 67 are grounded.

Artificial transmission line 70 comprises inductive elements 71, 73, 75 and 77, which are coupled together in series to microstrip line 55. Adjacent inductive elements are coupled together at a T-junction. To the remaining leg of each respective T-junction is coupled a corresponding FET 72, 74 or 76. The sources of FETs 72, 74, and 76 are grounded.

Artificial transmission line 80 comprises inductive elements 81, 83, 85 and 87, which are coupled together in series to microstrip line 49. Adjacent inductive elements are coupled together at a T-junction. To the remaining leg of each respective T-junction is coupled a corresponding FET 82, 84 or 86. The sources of FETs 82, 84, and 86 are grounded.

Each FET of the respective artificial transmission lines is used as a passive device by switching it between its on and off state. In the off state, the FET behaves much like a very large resistance in parallel with a shunt capacitance. In the on state, however, the resistance of the FETs is very low. Thus, in the on state, the FETs may be used to shorten the artificial transmission line and hence shorten the stub tuner, thereby increasing the equalizer's resonant frequency. Accordingly, it will be appreciated that in the illustrative embodiment, the center frequency of the equalizer may be shifted by switching FETs 66, 76, and 86 to the on state. In like fashion, the center frequency can be further shifted by switching FETs 64, 74, and 84 to the on state. The greatest shift is obtained by switching all of the FETs to the on state. It will therefore be readily apparent that by choosing how much of the artificial transmission line to short, the center frequency can be shifted to accommodate a variety of attenuation profiles, thereby allowing it to be used to compensate for the responses of different devices.

Many advantages of the present invention are attributable to its monolithic configuration. The parabolic response can be linearized over a frequency band by increasing the number of the circuit elements. Over its linear range, the equalizer can be used in the input matching circuit of solid state amplifiers to obtain flat gain response. This is accomplished by gain equalization of 6 dB/octave gain roll-off slope of the active devices. It is not necessary to increase the number of circuit elements to increase the equalizer circuit's attenuation level or profile. The attenuation range or profile of the equalizer circuit can be changed simply by changing the resistance of FET 54 and/or selecting different resistance values for resistors 28 and 48, and by reoptimizing the microstrip line widths and lengths to fit the required response curve. Further, in accordance with an embodiment of the invention exemplified in FIG. 4, the center frequency can be shifted to accommodate more than one type of device response by selectively shorting out part or all of the artificial transmission lines.

The equalizer circuits of the present invention do not impact the power consumption of TWTs or other devices to which they may be coupled because FETs used as passive devices consume little power. Additionally, either circuit can be implemented as an MMIC, thereby providing very small equalizers in large quantities at low cost. Additionally, either equalizer circuit may be configured as a portion of a multifunction MMIC which could provide gain shaping, phase calibration, amplitude calibration, and gain.

It will be understood that the embodiments described herein, including the resistor values given and lengths of the various microstrip lines, is merely illustrative and that a person skilled in the art may make many variations and modifications to the described embodiments utilizing functionally equivalent elements to those described. Any variations or modifications to the invention just described are intended to be included within the scope of said invention as defined by the appended claims.

What is claimed is:

1. An electrically tunable equalizer circuit for RF frequencies of various attenuation profiles, wherein said tunable equalizer has a predetermined center frequency, said tunable equalizer circuit comprising:

a main microstrip transmission line having an RF input port and an RF output port;

a stub tuner disposed proximately centrally on said main microstrip transmission line;

shifting means for selectively shifting said predetermined center frequency to compensate for said various attenuation profiles; and variable resistive means contained within said shifting means, wherein said variable resistive means is coupled to said stub tuner for providing a voltage variable resistance, said various resistive means being adapted to de-Q said stub tuner and thereby selectively determine an attenuation profile for said equalizer circuit.

2. The equalizer circuit according to claim 1 wherein said equalizer circuit is fabricated as a hybrid circuit on a substrate.

3. The equalizer circuit according to claim 2, wherein said variable resistive means includes a metal-semiconductor field-effect transistor.

4. The equalizer circuit according to claim 1, wherein said equalizer circuit is fabricated as part of a monolithic device.

5. The equalizer circuit according to claim 4, wherein said variable resistive means includes a metal-semiconductor field-effect transistor.

6. The equalizer circuit according to claim 1, further comprising a short circuited microstrip transmission line coupled to said variable resistive means.

7. The equalizer circuit according to claim 1, wherein said shifting means includes an artificial transmission line coupled to said variable resistive means, said artificial transmission line including at least one inductive element and a field effect transistor.

8. The equalizer circuit according to claim 1, wherein said equalizer further comprises:

a second stub tuner extending transversely from said main microstrip transmission line proximate said RF input port;

a third stub tuner extending transversely from said main microstrip transmission line proximate said RF output port;

means coupled to said second stub tuner to de-Q said second stub tuner, thereby selectively determining an attenuation profile for said equalizer circuit; and means coupled to said third stub tuner to de-Q said third stub tuner, thereby selectively determining an attenuation profile for said equalizer circuit.

9. The equalizer circuit according to claim 8, wherein said means to de-Q said second stub tuner and said means to de-Q said third stub tuner are resistors.

10. The equalizer circuit according to claim 8, wherein said equalizer circuit is fabricated as part of a monolithic device and said means to de-Q said second stub tuner and said means to de-Q said third stub are thin-film resistors.

11. The equalizer circuit according to claim 8, wherein said shifting means includes:

a first artificial transmission line coupled to said variable resistive means;

a second artificial transmission line coupled to said means to de-Q said second stub tuner; and a third artificial transmission line coupled to said means to de-Q said third stub tuner, wherein said first, second, and third artificial transmission lines include at least one inductive element and a field effect transistor.

12. An equalizer circuit for RF frequencies, wherein said equalizer circuit has a predetermined center frequency, said equalizer circuit, comprising:

a main microstrip transmission line having an RF input port and an RF output port;

a first transverse microstrip transmission line forming a first stub tuner extending transversely from said main microstrip transmission line proximate a central line bisecting said main microstrip transmission line;

means coupled to said first stub tuner to de-Q said first stub tuner, said means to de-Q said first stub tuner being adapted to provide a variable resistance;

a second transverse microstrip transmission line forming a second stub tuner extending transversely from said main microstrip transmission line proximate said RF input port;

means coupled to said second stub tuner to de-Q said second stub tuner;

a third transverse microstrip transmission line forming a third stub tuner extending transversely from said main microstrip transmission line proximate said RF output port; and means coupled to said third stub tuner to de-Q said third stub tuner; and shifting means coupled to said means to de-Q said first stub tuner, said means to de-Q said second stub tuner and said means to de-Q said third stub tuner for selectively shifting said predetermined center frequency.

13. The equalizer circuit according to claim 12, wherein said means to de-Q said first stub tuner is adapted to provide a voltage variable resistance.

14. The equalizer circuit according to claim 12, wherein said means to de-Q said first stub tuner includes a metal semiconductor field effect transistor.

15. The equalizer circuit according to claim 12, wherein said shifting means includes:

a first artificial transmission line coupled to said means to de-Q said first stub tuner;

a second artificial transmission line coupled to said means to de-Q said second stub tuner; and a third artificial transmission line coupled to said means to de-Q said third stub tuner, wherein said first, second, and third artificial transmission lines include at least one inductive element and a field effect transistor.

16. The equalizer circuit according to claim 15, wherein each of said artificial transmission lines comprises a plurality of inductive elements coupled in series and a plurality of field effect transistors, a respective field effect transistor being coupled to a corresponding junction of adjacent inductive elements, whereby said artificial transmission line may be selectively shorted by applying voltage to said field effect transistors to shift said center frequency of said equalizer circuit.

* * * * *